United States Patent [19]
Groom et al.

[11] Patent Number: 4,755,770
[45] Date of Patent: Jul. 5, 1988

[54] LOW NOISE CURRENT SPECTRAL DENSITY INPUT BIAS CURRENT CANCELLATION SCHEME

[75] Inventors: Terry J. Groom, Palm Bay, Fla.; James P. Furino, Jr., West Lawn, Pa.

[73] Assignee: Harris Corporation, Melbourne, Fla.

[21] Appl. No.: 896,097

[22] Filed: Aug. 13, 1986

[51] Int. Cl.$^4$ .............................................. H03F 3/04
[52] U.S. Cl. ...................................... 330/296; 330/288
[58] Field of Search ............... 330/257, 261, 288, 296; 323/315, 316

[56] References Cited

U.S. PATENT DOCUMENTS

| | | | |
|---|---|---|---|
| 4,263,562 | 4/1981 | Seiler | 330/288 X |
| 4,575,685 | 3/1986 | Dobkin et al. | 330/257 X |
| 4,639,684 | 1/1987 | Laude | 330/257 X |

FOREIGN PATENT DOCUMENTS 134513  10/1980  Japan .................................. 330/261

Primary Examiner—James B. Mullins
Attorney, Agent, or Firm—Barnes & Thornburg

[57] ABSTRACT

A current cancellation circuit having, and method for producing, a low noise spectral density current for cancelling the DC input bias current of an input signal to an amplifier. The cancellation circuit provides for generating a DC cancelling current having a magnitude K times greater than the magnitude of the input DC bias current and then reducing the same by K times. The resulting cancelling current has a reduced noise current spectral density associated with it, thereby reducing the overall noise current spectral density of the input stage.

8 Claims, 4 Drawing Sheets

LOW NOISE CURRENT SPECTRAL DENSITY INPUT BIAS CURRENT CANCELLATION SCHEME

BACKGROUND AND SUMMARY OF THE INVENTION

The present invention relates generally to operational amplifier, and more particularly, to an improved low noise input stage of an amplifier circuit.

It is generally desirable to include a current cancellation circuit in operational amplifiers for the purpose of cancelling the DC bias current associated with the input signal. One such cancellation circuit is shown in U.S. Pat. No. 3,714,600 to Kuijk et al. This patent shows the use of a constant current source and a measuring transistor arranged at the base and collector of an input transistor respectively. A current proportional to the collector-emitter current of the input transistor is supplied from the constant current source to the base of the input transistor, resulting in reducing the DC bias current flowing into the input stage. Although the DC bias current cancellation is achieved in Kuijk, the noise current spectral densities associated with the DC bias and cancelling currents statistically add due to the random nature of noise, thereby increasing the over all noise spectral density associated with the input signal. The increase in noise density at the input stage degrades the input signal and therefore decreases the accuracy of the amplifier output. Additionally, the inclusion of a measuring transistor in the path of the AC signal of the amplifier further results in a degradation of the AC performance of the amplifier.

Another circuit commonly used for bias current cancellation includes a base current generator connected to a current mirror having a one-to-one ratio. A current proportional to the DC bias current of the input signal is provided by the current generator to the input of the mirror, whereby an equivalent current is reflected at the mirror output. This output current is then combined with the amplifier input signal for reducing the input bias current associated with the same. Although the two DC currents cancel out algebraically in this circuit design, the noise current spectral densities of the two DC current signals add together. As in Kuijk et al., the adding of the noise currents spectral densities results in producing an even potentially larger noise level of the input signal.

The noise associated with these DC currents derive from a plurality of sources in analog devices. Shot Noise Current results in the space charge layers by carriers being repelled through the electric field. Frequency Dependent Noise Current and Burst Noise are noise representations attributed to the sporadic nature of thermal generation and recombination. It is the combination of these noise currents that result in the degradation of the input signal to the operational amplifier.

It is, therefore, an object of the present invention to provide an amplifier circuit with a reduced noise current spectral density associated with the cancellation current.

It is further an object of this invention to provide a DC input bias current cancellation circuit which provides substantial reduction in noise current spectral density (NCSD) of the input signal while cancelling out the DC bias currents of the input signal.

It is also an object of this invention to provide a method for producing an input DC bias cancellation current having a low noise current spectral density.

These and other objects of the invention are attained in an amplifier having an input bias current cancellation circuit comprising a first means for providing a DC current of an amplitude K times greater than the amplitude of the DC bias current, a second means for reducing the output current of the current source by K times, and a third means for cancelling the DC bias current of the input signal with the reduced current.

In the preferred embodiment, the first means includes a current source and the second means includes a current mirror having a ratio of 1/K. By providing a current greater than the DC input bias current to the input side of the current mirror, the output current of the mirror is equivalent to the DC bias current for cancelling the same, but with the quality of having reduced noise spectral density associated with the cancelling current. This provides a substantially lesser amount of noise to add with the noise inherent with the DC input bias current, and thus, reduces the overall noise spectral density of the input stage of the amplifier.

Other objects, advantages and novel features of the present invention will become apparent from the following detailed description of the invention when considered in conjunction with the accompanying drawings.

DETAILED DESCRIPTION OF THE DRAWINGS

Figure 1:
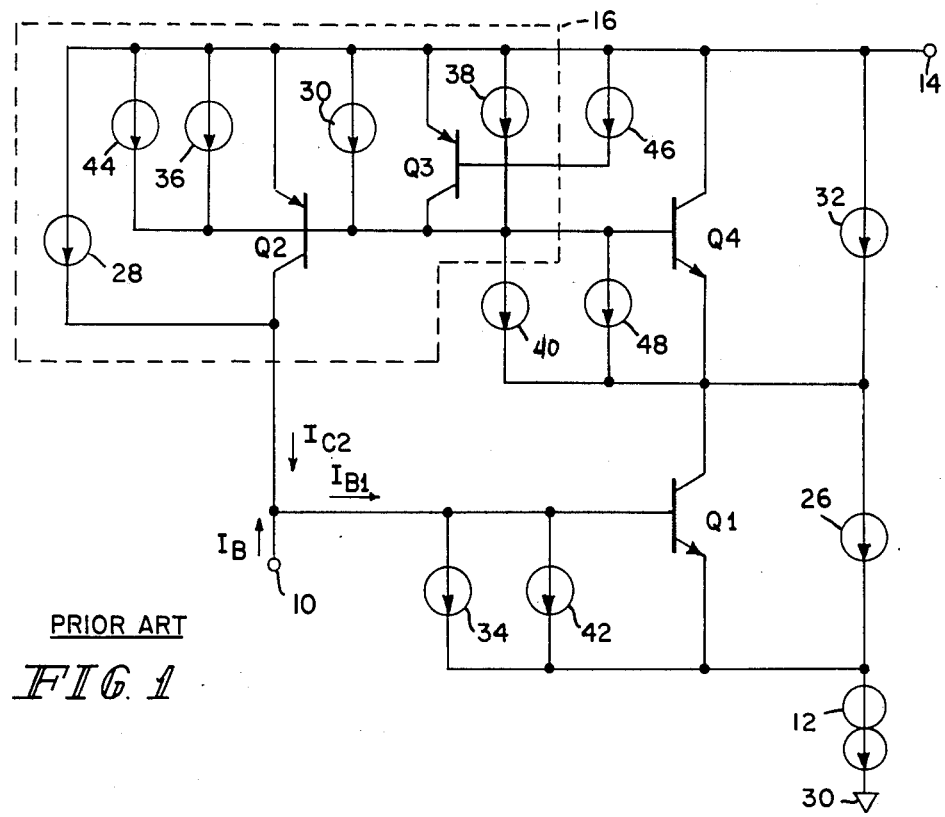
FIGS. 1 and 2 are schematics of prior art input bias current cancellation circuits.

FIG. 1 shows a prior art input bias current cancellation circuit including current sources representing the sources of noise within the circuit. The cancellation circuit includes an input NPN transistor $Q_1$ having its base connected to an input 10, its emitter to a current source 12 and its collector to the emitter of an NPN transistor $Q_4$. Transistor $Q_4$ in turn has its collector connected to a power source 14, and its base to the input side of a current mirror 16. Transistors $Q_2$ and $Q_3$ form the current mirror 16 with the emitters of both $Q_2$ and $Q_3$ connected to a power source 14. The collector and base of $Q_3$ and the base of $Q_2$ are coupled to the base of $Q_4$; and the collector of $Q_2$ is connected to the input terminal 10 and base of $Q_1$ for providing the cancellation current to the input.

The representation of the noise currents are shown in FIG. 1 as current sources for the respective shot noise and frequency dependent noise generated by the transistors. The collector shot noise current sources 26, 28, 30 and 32 are connected across the respective collectors and emitters of transistors $Q_1$, $Q_2$, $Q_3$ and $Q_4$, while the base shot noise current sources 34, 36, 38 and 40 are connected between the respective bases and emitters of $Q_1$, $Q_2$, $Q_3$ and $Q_4$. The frequency dependent noise current sources, 42, 44, 46, 48 are connected between the respective bases and emitters of $Q_1$, $Q_2$, $Q_3$ and $Q_4$ in parallel with the respective base shot noise current sources.

Figure 2:
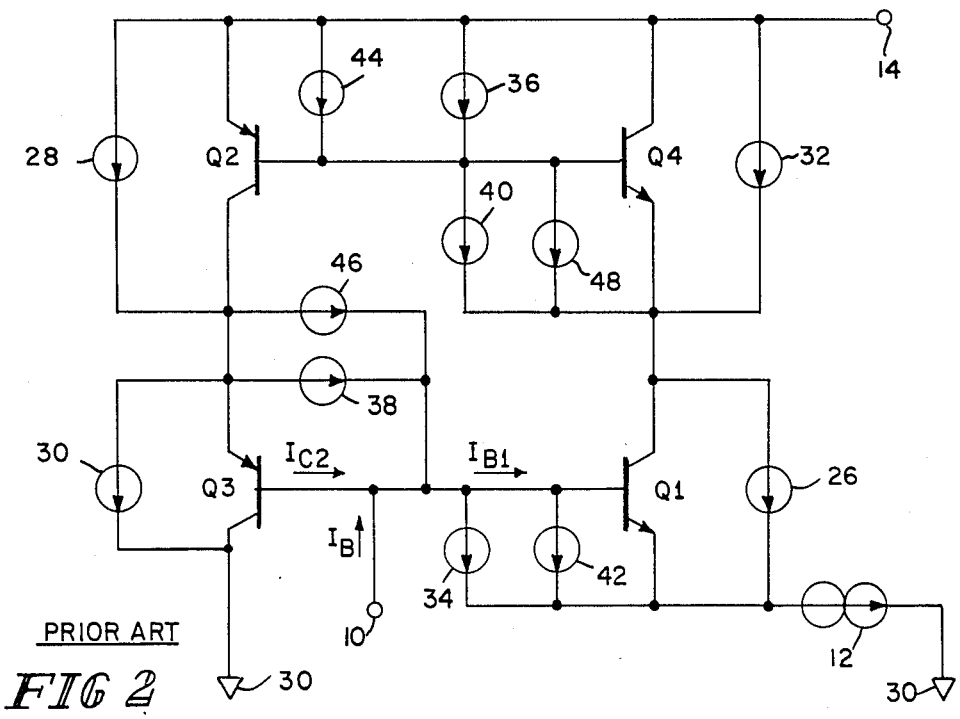

In FIG. 2, a second embodiment of the prior art shows $Q_4$ coupled to $Q_1$ as in FIG. 1, but with the base of $Q_4$ connected only to the base of PNP transistor $Q_2$. $Q_2$ in turn has its collector connected to the emitter of $Q_3$ with the collector of $Q_3$ grounded and the base of $Q_3$ connected to both the input terminal 10 and the base of $Q_1$. Similar to FIG. 1, the noise current sources are shown connected to their respective base, collector and emitters of $Q_1$, $Q_2$, $Q_3$ and $Q_4$.

Figure 3:
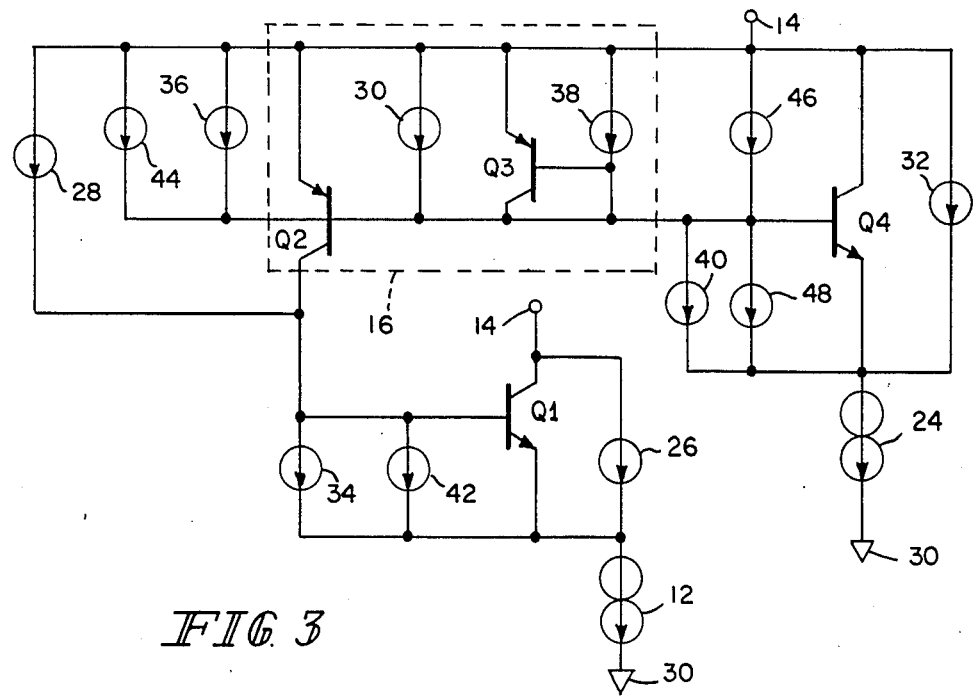
FIGS. 3–6 are schematics of preferred embodiments of input bias noise current cancellation circuits according to the present invention.

The present invention shown in the first preferred embodiment of FIG. 3 provides an improvement over the prior art. The emitter of $Q_4$ is connected to a second independent current source 24 having a magnitude K greater than the first current source 12. The base and collector of $Q_4$ remains connected to the input side of the current mirror 16 and the power source 14 respectively. The current mirror has a 1/K ratio so that the collector current $Q_2$ is equal to the base current of $Q_1$.

As in FIG. 1, the emitter of $Q_1$ is connected to the first current source 12 and its base to input terminal 10, but the collector is connected directly to power source 14, thereby removing $Q_4$ from the collector path of $Q_1$. The remaining connections of transistors $Q_2$ and $Q_3$ and the connections of the current sources representing the sources of shot and frequency dependent noise are the same as that in FIG. 1, and therefore, have the same reference numbers.

Figure 4:
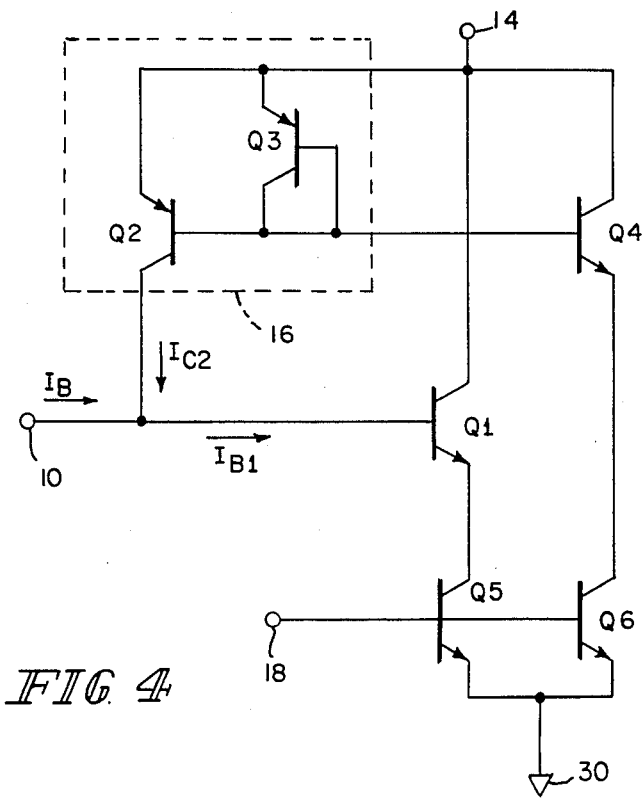

In another preferred embodiment of the present invention shown in FIG. 4, the first and second current sources 12 and 24 of FIG. 3 have been replaced respectively by a pair of NPN transistors $Q_5$ and $Q_6$. An input terminal 18 to the bases of $Q_5$ and $Q_6$ provides a d.c. bias to $Q_5$ and $Q_6$. The collectors of $Q_5$ and $Q_6$ are connected to respective emitters of $Q_1$ and $Q_4$, while the emitters of $Q_5$ and $Q_6$ are both connected to a common ground potential 30. Similar to the current source 24 of FIG. 3, the transistor area of $Q_6$ is chosen such that it will provide a collector-emitter current through $Q_4$ which will be K times as large as the collector-emitter current through $Q_1$. This larger current will be reduced to a level equal to that of the input DC bias current level by the current mirror 16 which receives as an input the base current of $Q_4$ and provides as an output a base current to $Q_1$ which is 1/K the base current of $Q_4$. The output of the current mirror 16 will then be combined with the input signal for cancelling the input DC bias current.

Figure 5:
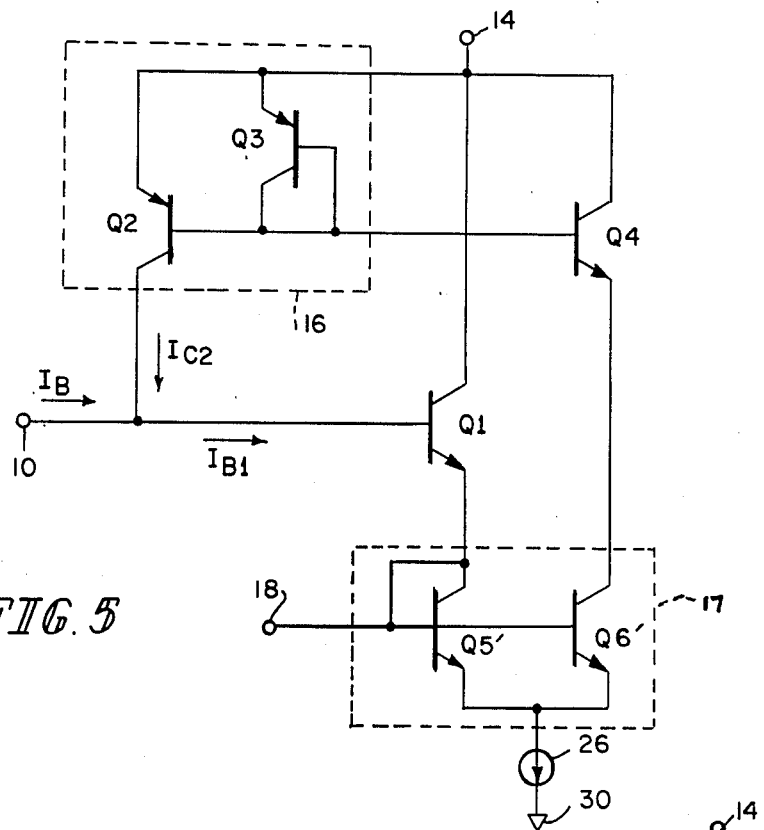

In the preferred embodiment shown in FIG. 5, a current source 26 is provided between the emitters of $Q_5'$ and $Q_6'$ and ground potential 30. The base and collector of $Q_5$ are also coupled together, thereby providing a diode connection between the emitter of $Q_1$ and current source 26. This embodiment provides a current mirror 17 in place of the separate current sources 12, 24 of FIG. 3.

Figure 6:
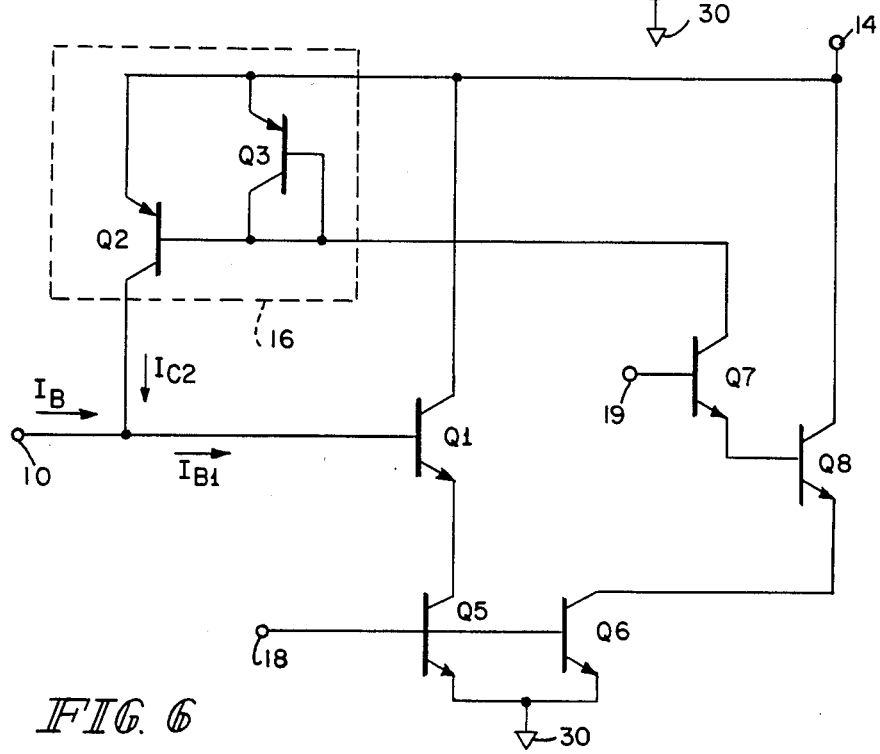

The preferred embodiment shown in FIG. 6 is a modification of FIG. 4, whereby the amplification transistor $Q_4$ is replaced with a pair of cascading NPN pair of transistors $Q_7$ and $Q_8$. The collector of $Q_8$ is connected to the power supply 14 and its emitter to the collector of $Q_6$. The collector of $Q_7$ is connected to the base and collector of $Q_3$, and to the base of $Q_2$ while the emitter of $Q_7$ is coupled to the base of $Q_8$. The base of $Q_7$ is attached to a third input terminal 19 for receiving a d.c. bias signal for providing a collector-base voltage of $Q_8$ as the same as $Q_1$. This could be accomplished by bootstrapping terminal 19 to the input terminal 10.

The following is an analysis of the noise contribution of the current cancellation circuits discussed above. Because noise sources can be modeled as providing statistically uncorrelated AC sources, the following equations are formulated in AC squared analysis.

The overall contribution of noise to the input stage of an operational amplifier having the cancellation circuit shown in FIGS. 1 and 3 may be represented by the equation:

$$I_B^2{}_{noise} = I_{B1}^2{}_{noise} + I_{C2}^2{}_{noise} \qquad (1)$$

The noise components of $I_{B1}$ are generated by the noise associated with the currents to transistor $Q_1$ and is represented by:

$$I_{B1}^2 \text{ noise} = I_{SB1}^2 + I_{F1}^2 + \frac{I_{SC1}^2/\beta_1}{1} \qquad (2)$$

The noise components of $I_{C2}$ are generated by the noise associated with the remaining transistors $Q_2$, $Q_3$ and $Q_4$ and is represented by:

$$I_c^2 \text{ noise} = \qquad (3)$$

$$I_{SC2}^2 + (I_2/I_3)^2 (I_{F2}^2 + I_{SB}^2 + I_{SC3}^2 + I_{SB3}^2 + I_{F3}^2 +$$

$$(I_{SB4}^2 + I_{F4}^2 + \frac{I_{SC1}^2 + I_{SC4}^2)}{\beta_4^2}$$

Assuming $\beta^2$ is large with respect to the respective noise currents, the terms with $\beta^2$ as a divisor may be eliminated. This results in an overall noise contribution of the input signal as:

$$I_B^2 = I_{SB1}^2 + I_{F1}^2 + I_{SC}^2 + (I_{C2}/I_B)^2(I_{SC3}^2 + I_{SB4}^2 + I_{F4}^2) \qquad (4)$$

Substituting the following noise parameters:

Shot Noise $= 2qI$ \qquad (5)

Frequency Dependent Noise $= \dfrac{K_F}{f}(I)^a + \dfrac{K_B (I)^c}{1 + f/f_c}$ \qquad (6)

where
$K_F$ = Flicker Noise Coefficient
f = Frequency
a = D.C. Current Exponent (Flicker Noise)
$K_B$ = Burst Noise Coefficient
fc = Burst Noise Corner Frequency
c = D.C. Current Exponent (Burst Noise)
into equation (4), the resulting current noise representation becomes:

$$I_B^2 \text{ noise} = 2q\, I_{B1} + 2q\, I_{C2} + \frac{K}{f}(I_{B1})^a + \frac{K\,(I_{B1})^c}{1 + f/f_c} + \qquad (7)$$

$$(I_{C2}/I_{C3})^2(2q\, I_{C3} + 2q\, I_{B4} + \frac{K}{f}(I_{B4}) + \frac{K_B\, I_4}{1 + f/f_c}$$

The circuit arrangement of FIG. 1 provides the following current relationships between the transistors:

$$I_{C3} = I_{B4} \qquad (8)$$

$$I_{B3} = KI_{B2} \quad (9)$$

$$I_{C3} = KI_{C2} \quad (10)$$

$$I_{B4} = KI_{B1} \quad (11)$$

where K represents the ratio of the current mirror transistors $Q_3/Q_2$.

Substituting equations (8–11) into equation (7) provides:

$$I_B{}^2 \text{ noise} = (1 + 1/K)\left(4qI_{B1} + \frac{KF}{f}(I_{B1})^a\right) + \frac{K_B(I_{B1})^c}{1 + f/fc} \quad (12)$$

Because the arrangement in the Prior Art of FIG. 1 requires the base current of $Q_4$ to be equal to the base current of $Q_1$ in order for $Q_4$ to properly drive the collector of $Q_1$, the current mirror 16 must have a one-to-one ratio between $Q_2$ and $Q_3$, and thus, K in equation (12) is equal to one. This permits the collector current of $Q_2$ to be proportional to the input bias DC current for the purpose of cancelling the bias current from the input signal. As a result of these requirements, the resulting noise current to the input stage of the amplifier is increased because of the noise associated with the cancelation circuit adds with the noise generated by the DC bias current itself. Thus, even though the DC bias current is algebraically cancelled with the cancelling current, the noise associated with both currents add together to constitute the overall current noise spectral density as the input stage.

In FIG. 2, a similar analysis may be performed, whereby the resulting noise contribution is represented by the following equation:

$$I_B{}^2 \text{ noise} = 2q(I_{B1} + I_{B2} + I_{B3} + I_{B4}) + \frac{KF}{f}(I_{B1})^a + \quad (13)$$

$$(I_{B2})^a + (I_{B3})^a + (I_{B4})^a + \frac{Kc}{1 + f/fc}(I_{B1})^c +$$

$$(I_{B2})^c + (I_{B3})^c + (I_{B4})^c$$

This arrangement provides the following equations:

$$I_{B4} = I_{B3} = I_{B2} = I_{B1} \quad (14)$$

Substituting these equations into equation (13) provides:

$$I_B{}^2 \text{ noise} = 2q(4I_{B1}) + \frac{Kf}{f}(4I_{B1})^a + \frac{Kc}{1 + f/fc}(4I_{B1})^c \quad (15)$$

As with FIG. 1, this embodiment of FIG. 2 is dependent upon the value of K. Thus, because K is equal to one, the noise generated by the current cancellation circuit of FIG. 1 is as large as the input signal itself while the noise generated by the cancellation circuit of FIG. 2 is three times as large as the input signal itself.

The present invention recognizes that the noise contribution of the current cancellation circuit can be reduced by designing the current mirror 16 to have an output current less than its input current, and thus, have the effect of increasing the value of K of equation (12). As K becomes larger, the noise contribution of the feedback path is reduced.

In order to facilitate this reduction of output current of the current mirror 16 while still maintaining the proportionality of the current mirror output to that of the input DC bias current for cancelling the same, an independent current source 24 of a magnitude K greater than current source 12 is added to the emitter of $Q_4$. This change in the circuit as shown in FIG. 3 allows for the input of the current mirror 16 to be of magnitude K greater than its output, and thus, allowing for the output current of the mirror to be the same magnitude as that of the DC bias current. This results in a cancellation current having a substantially reduced noise current spectral density, while still maintaining the magnitude needed to cancel the DC bias current of the input signal. Additionally, by removing $Q_4$ from the collector path of the input transistor $Q_1$, the degradation of AC performance such as bandwidth limitations is eliminated.

Figure 7:
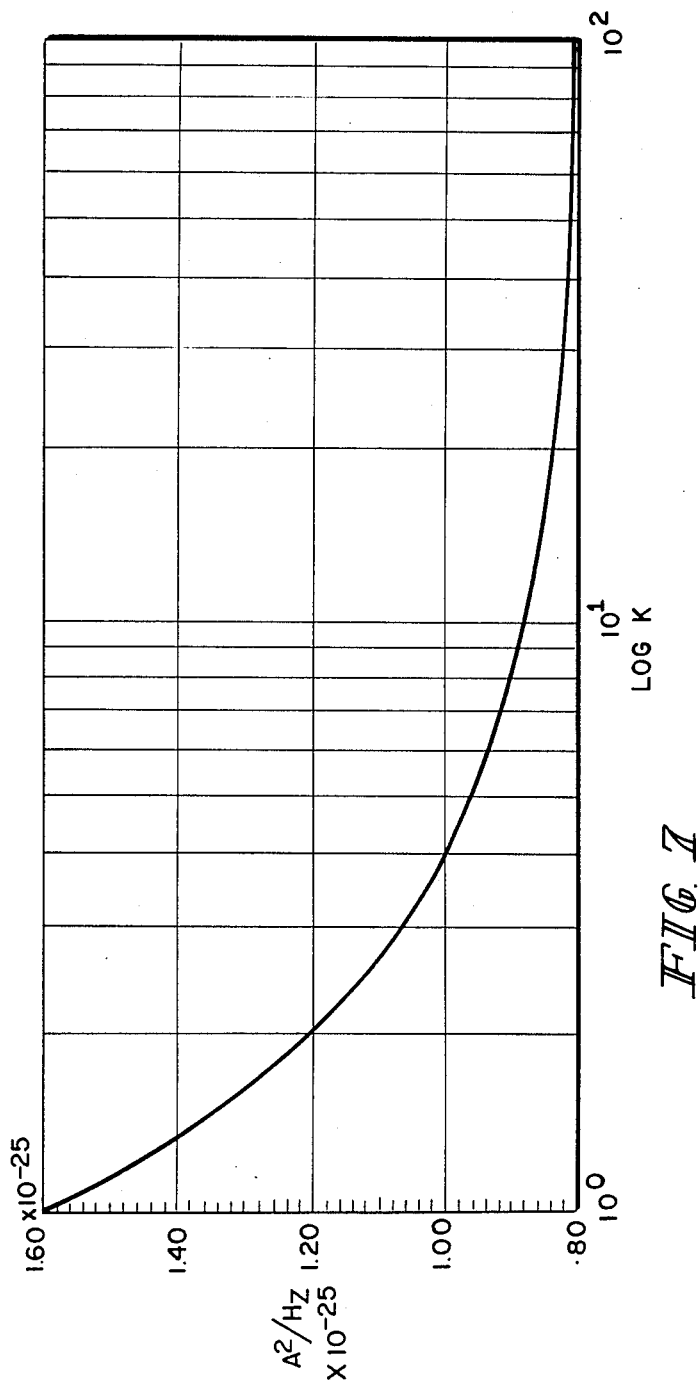
FIG. 7 is a graph showing the relationship between the value of K and the noise current spectral density of the cancellation circuit.

The reduction of the cancellation circuit noise contribution is, therefore, dependent upon the value of K, e.g. ratio of the current mirror 16 and the corresponding magnitude of the second current source 24. FIG. 7 shows the effect of increasing the value of K with respect to the noise current spectral density.

The remaining preferred embodiments of the invention shown in FIGS. 4–7 show various means of providing an increase in the emitter current of $Q_4$ with respect to the emitter current of $Q_1$ by a factor of K. In FIG. 4, the transistors $Q_5$ and $Q_6$ which are respectively arranged at the emitters of $Q_1$ and $Q_4$ provide the appropriate current sinks for implementing the K ratio of emitter currents as discussed above. This is attained by transistor $Q_5$ having an area $1/K$ times the area of transistor $Q_6$.

In FIG. 5, the transistors $Q_5'$ and $Q_6'$ are arranged as a current mirror 17 with current source 26 included to provide the K ratio of emitter currents. In FIG. 6, the transistor $Q_4$ is replaced by a cascading pair of transistors $Q_7$ and $Q_8$. This allows $Q_8$ to be biased at a d.c. potential independent of the d.c. potential at the collector of $Q_7$.

Although the preferred embodiments show the use of bipolar transistors, the invention may also be implemented with other types of transistors. Additionally, the invention can be implemented reversing the PNP and NPN devices for use with negative input signals.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. In an input bias current cancellation circuit including an input means having a first transistor means coupled serially to a second transistor means, for receiving an input signal and having a DC bias current of a known magnitude, said cancellation circuit providing a DC cancellation current having the same magnitude as the DC bias current, and a summing means provided at said input means for receiving said cancellation current and said input signal for cancelling said DC bias current, wherein the improvement of said cancellation circuit comprises:

a DC current source means including a third transistor means coupled serially to a fourth transistor means, said first and third transistor means having equal areas and said fourth transistor means having an area K times the area of said second transistor means for generating a DC current through said third transistor means having a magnitude K times greater than the known magnitude of said DC bias current of said input signal conducting through said first transistor means; and a reducing means for reducing the magnitude of said DC current by a factor of K and providing the reduced current to said summing means, wherein said factor of K has a selected value greater than one.

2. The cancellation circuit of claim 1, wherein said reducing means includes a current mirror means having an output coupled to said first transistor means, and an input coupled to said third transistor means, the input current of said current mirror means is K times greater than the output current of said current mirror means.

3. An input bias current cancellation circuit comprising:

a first transistor having a base for receiving input signals;

a first current source transistor coupled to said first transistor for producing a known magnitude of DC bias current in the base of said first transistor;

a second transistor and a second current source transistor coupled to said second transistor and biased as said first transistor and said first current source transistor are connected and biased for providing a DC current in the base of said second transistor having a magnitude K times greater than the known magnitude of DC bias current in the base of said first transistor; and reducing means connected to the base of said first and second transistors for providing, as a cancellation current at the base of said first transistor, said DC current in the base of said second transistor reduced by a factor of K, wherein said factor of K has a selected value greater than one.

4. The cancellation circuit of claim 3, wherein said reducing means includes a current mirror means having an output and an input, said input to output ratio being equivalent to the value of K.

5. The cancellation circuit of claim 4, wherein said current mirror means includes a third and a fourth transistor for forming the respective input and output of said current mirror means, said third transistor having an area K times larger than said fourth transistor for providing an output current of said current mirror means having a magnitude of K times smaller than the magnitude of said input current of said current mirror means.

6. The cancellation circuit of claim 5, wherein said first and second transistors are NPN transistors and said third and fourth transistors are PNP transistors, wherein a base of said first transistor is connected to the output of said current mirror means and a base of said second transistor is connected to the input of said current mirror means.

7. In an input bias current cancellation circuit including an input means having a first transistor means coupled serially to a second transistor means for receiving an input signal and having a DC bias current of a known magnitude, said cancellation circuit providing a DC cancellation current having the same magnitude as the DC bias current, and a summing means provided at said input means for receiving said cancellation current and said input signal for cancelling said DC bias current, wherein the improvement of said cancellation circuit comprises:

a DC current source means including a third and fourth transistor means cascadedly coupled and a fifth transistor means coupled serially with said fourth transistor means, the area of said second transistor means being K times smaller than the area of said fifth transistor means for providing a DC current through said cascaded third and fourth transistor means having a magnitude K times greater than the known magnitude of said DC bias current of said input signal; and a reducing means for reducing the magnitude of said DC current conducted through said cascaded third and fourth transistor means by a factor of K and providing the reduced current to said summing means, wherein said factor of K has a selected value greater than one.

8. The cancellation circuit of claim 7, wherein said reducing means includes a current mirror means having an output coupled to said first transistor means and an input coupled to said third transistor means, the input current of said current mirror means is K times greater than the output current of said current mirror means.

* * * * *